United States Patent [19]

White et al.

[11] Patent Number: 4,558,235

[45] Date of Patent: Dec. 10, 1985

[54] MESFET LOGIC GATE HAVING BOTH DC AND AC LEVEL SHIFT COUPLING TO THE OUTPUT

[75] Inventors: William A. White, Garland, Tex.; Mooshi R. Namordi, Acton, Mass.

[73] Assignee: Texas Instruments Incorporated, Dallas, Tex.

[21] Appl. No.: 528,200

[22] Filed: Aug. 31, 1983

[51] Int. Cl.[4] .................. H03K 19/017; H03K 19/094
[52] U.S. Cl. ..................................... 307/450; 307/443; 307/448; 307/320
[58] Field of Search ............... 307/443, 448, 450, 246, 307/581, 304, 320; 357/22 S

[56] References Cited

U.S. PATENT DOCUMENTS

| | | | |
|---|---|---|---|
| 4,177,390 | 12/1979 | Cappon | 307/450 |
| 4,300,064 | 11/1981 | Eden | 307/450 X |
| 4,404,480 | 9/1983 | Ransom et al. | 307/450 X |
| 4,405,870 | 9/1983 | Eden | 307/450 X |
| 4,438,351 | 3/1984 | Schuermeyer | 307/450 |
| 4,450,369 | 5/1984 | Schuermeyer | 307/450 |
| 4,469,962 | 9/1984 | Snyder | 307/443 X |

Primary Examiner—Stanley D. Miller
Assistant Examiner—D. R. Hudspeth
Attorney, Agent, or Firm—Robert Groover; Melvin Sharp; James T. Comfort

[57] ABSTRACT

A MESFET logic gate wherein a logic switch node is both a-c coupled to the output node, preferably by a capacitor network and is also separately DC coupled to it, preferably by a voltage level shifter circuit. The direct capacitative coupling increases the high-frequency cut-off frequency, and reduces the current requirement of the voltage level shifter circuit. The voltage level shifter circuit, even using small width devices, provides low frequency and DC response, so that circuits using the gate of the present invention do not require initialization and refresh cycle. Thus, both high speed and low power are attained.

21 Claims, 9 Drawing Figures (A) TWO INPUT NOR $Z = \overline{A+B}$ (B) TWO INPUT NAND $Z = \overline{A \cdot B}$

SDFL CELL WITH
FEED FORWARD CAPACITOR

MESFET LOGIC GATE HAVING BOTH DC AND AC LEVEL SHIFT COUPLING TO THE OUTPUT

BACKGROUND AND SUMMARY OF THE INVENTION

The present invention relates to high-speed integrated circuit logic. In particular, the present invention relates to gallium arsenide logic integrated circuits.

As the gate count on a digital IC chip increases, the power dissipation per logic gate must decrease. This is because the chip temperature rise due to the total power dissipated must not exceed the limit set by reliability and performance considerations. It is generally known the the power dissipation, $P_d$, of a depletion mode MESFET logic gate decreases rapidly with the magnitude of the pinch-off voltage, $V_p$, that is, $P_d$ varies as the approximate magnitude of $V_p^2$. However, two problems arise when reduction of pinchoff voltage is used for reducing the power dissipation. First, can the sigma over mu (variance over mean) spreads of the devices' electrical characteristics be maintained reproducibly over large areas as the magnitude of $V_p$ is reduced? This objection may become less serious as material and processing technologies improve in the future. Second, the relationship between bit-error-rate (BER) and the combination of signal noise margin and clock rate is not known. Since it is reasonable to assume that the BER increases rapidly with decreasing noise margin, it could become the dominant factor in the decision making process for selecting $V_p$ for many applications.

The present invention provides a GaAs MESFET logic gate which consumes significantly less power and is faster than the more conventional BFL and SDFL logic gates. The gate uses depletion mode FET's and is a static one.

Thus, it is an object of the present invention to provide a gallium arsenide logic technology wherein power dissipation is reduced without sacrificing the speed of prior art logic technologies.

Gallium arsenide MESFET logic provides roughly triple the speed of silicon MESFET logic, for similar circuit dimensions, but power dissipation is a substantially worse problem in gallium arsenide. Similar speed advantages may be obtained in other III-V materials, but power dissipation remains a great problem.

It is a further object of the present invention to provide a III-V depletion mode MESFET logic gate which improves the speed of prior art III-V depletion mode MESFET logic gates with no increase in power dissipation. It is a further object of the invention to provide a gate which improves the power dissipation of prior art III-V depletion mode MESFET logic gates, without sacrificing the speed of the prior art designs.

Depletion mode gallium arsenide MESFET technology has the further advantage of relatively mature and familiar processing techniques, as well as familiarity to logic designers.

The conventional depletion mode GaAs MESFET logic gate, first introduced by Van Tuyl and Liechti [1] is shown in FIG. 1. This cell type is frequently referred to as a buffered FET logic (BFL) gate. The cell has a logic branch and a voltage level shifter circuit. For optimum speed performance, the branches are designed to have nearly equal response times. The arrangement shown in FIG. 1 dissipates approximately 50 mW at standard bias voltages, about 80% of which is dissipated in the VS branch. As shown at the bottom of FIG. 1, the cell has a low-pass filter type response.

FIG. 2 shows the capacitively coupled logic (CCL) gate proposed by Livingstone and Mellor infra. This cell has a bandpass filter type response and, consequently, must be operated above the lower cutoff frequency $f_{cl}$. The $f_{cl}$ is typically about 6 kHz (depending on the particular layout employed). The upper cutoff-frequency, $f_{cu}$, is about 35% greater than that of the BFL cell of equal width for unity fan-out (FO). This advantage decreases with FO. The measured power dissipation of the 50 micron wide cell fabricated was approximately 20 mW for $V_p = -2.5$ V which scales to approximately 8 mW for 20 micron wide cells. The main disadvantage of the CCL cell is that (due to the low-frequency cutoff) it must be initialized before proper operation can proceed. Accordingly, for many applications, its use will require additional initialization and refresh circuitry.

Thus, it is an object of the present invention to provide a gallium arsenide logic gate which has high speed and low power dissipation.

It is a further object of the present invention to provide a gallium arsenide logic gate which has high speed and low power dissipation, and does not require initialization or refresh cycles.

To accomplish these and other objectives, the present invention provides a logic cell wherein the logic switch node, i.e., a node which is selectively pulled down by one or more transistors controlled by the input signal(s), is coupled both by a DC circuit (preferably a voltage level shifter circuit) and also by a separate AC circuit (preferably a feed-forward capacitor) to the output node. This provides both the desirable high-frequency characteristics permitted by capacitative coupling, and the DC response provided by the use of the voltage level shifter circuit. Moreover, since the cell has DC response, initialization and refresh cycles are not necessary. Since the feed-forward capacitor will carry a substantial part of the logic signal, the width of the devices in the voltage level shifter circuit can be reduced. This greatly reduces power dissipation in the device.

The following publications provide useful background information on gallium arsenide logic gates, and all of them are hereby incorporated by reference:

R. L. Van Tuyl and C. A. Liechti, "High-speed integrated logic with GaAs MESFET's," in *ISSCC Dig. Tech. Papers*, p. 114, 1973. See also R. L. Van Tuyl, C. A. Liechti, R. E. Lee, and E. Gowen, "GaAs MESFET logic with 4 GHz clock rate," *IEEE J. Solid-State Circuits*, SC-12, p. 485, 1977. See also by same authors, "Gallium Arsenide spawns speed," *IEEE Spectrum*, vol. 14, p. 40, March 1977.

B. M. Welch and R. C. Eden, "Planar GaAs integrated circuits fabricated by ion implantation," in *IEDM Dig. Tech. Papers*, p. 205, 1977. See also R. C. Eden, B. M. Welch, R. Zucca, and S. I. Long, "The prospects of ultrahigh-speed VLSI GaAs digital logic," *IEEE Trans. Electron Devices*, ED-26, p. 299, 1979.

A. W. Livingstone and P. J. T. Mellor, "Capacitor coupling of GaAs depletion mode FET's," 1980 *GaAs IC Symposium Abstracts*, paper no. 10.

M. R. Namordi and W. M. Duncan, "The effect of logic cell configuration, gatelength, and fan-out on the propagation delays of GaAs MESFET logic gates," *IEEE Trans. Electron Devices*, ED-29, p. 402, 1982.

R. Van Tuyl and C. A. Liechti, "Gallium Arsenide digital integrated circuits," Technical Report AFAL- TR-74-40 to Air Force Avionics Laboratory, WPAFB, March, 1974.

BRIEF DESCRIPTION OF THE DRAWINGS

The present invention will be described with reference to the accompanying drawings, wherein.

DESCRIPTION OF THE PREFERRED EMBODIMENTS

Figure 1:
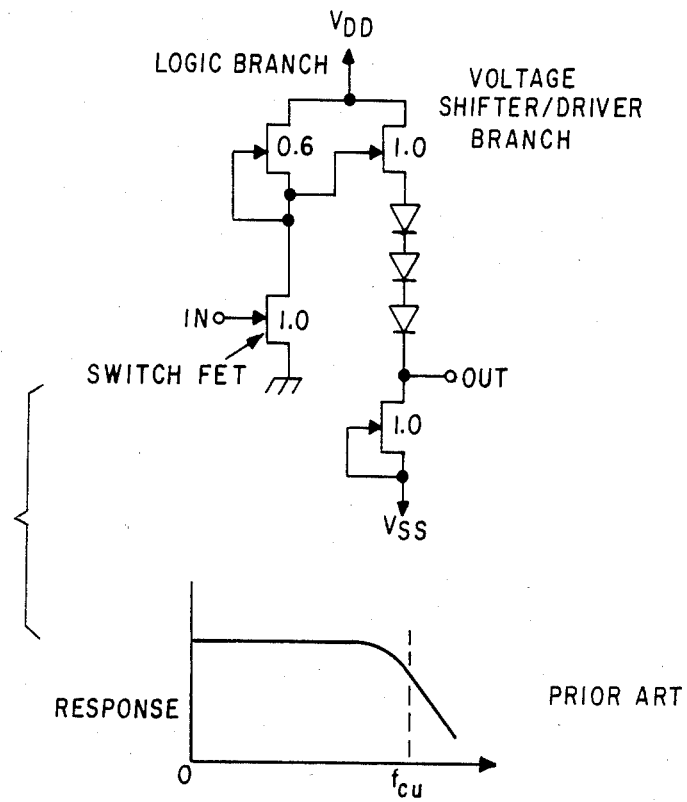
FIG. 1 shows the BFL logic cell of the prior art, with its characteristic frequency response.
Figure 2:
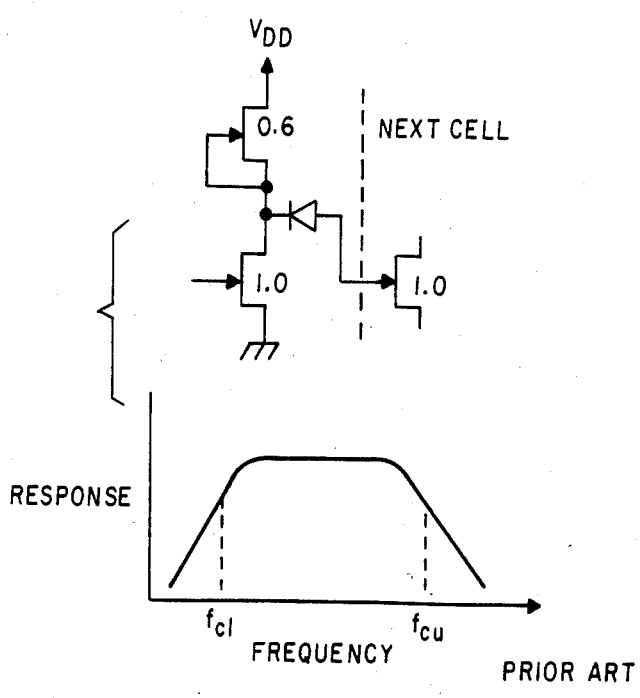
FIG. 2 shows the CCL cell of the prior art, with its characteristic frequency response.

The present invention teaches a gallium arsenide logic gate which couples the logic switch node to the output node both through a voltage level shifter circuit (for DC coupling) and also through a feed-forward capacitor (for AC coupling). The presently preferred embodiment of this invention will now be described in detail, but it should be remembered that the inventive features of the present invention can be embodied in a wide variety of other embodiments. That is, the doping levels, device types, number of voltage-shifting diodes, device widths, etc. can all be widely modified and varied. Moreover, the present invention teaches a novel logic gate, but this novel logic gate can be used to configure a tremendous variety of logic circuits. Thus, the range of possible applications of the present invention to complete logic circuits is immense.

The present invention will be described with primary reference to an inverter, since this provides a very simple logic gate on which a comparison of the present invention with prior-art logic types are based. However, the present invention is also applicable to a wide variety of other types of logic gates, including but not limited to, the NAND gate and NOR gate embodiments shown in FIGS. 6 and 7, respectively. That is, any desired logic gate can be implemented according to the present invention, by providing transistors which produce a signal on a logic switch node corresponding to the inputs on one or more input nodes. The MESFET implementation of these simple logic elements is well known to those skilled in the art. The present invention teaches novel methods of coupling such a logic switch node (which must also be coupled to pull-up devices) to an output node, so that a logic gate having fan-out capability is provided.

The present invention is preferably embodied in gallium arsenide MESFET technology. That is, a semi-insulating substrate comprising chromium-doped or undoped gallium arsenide is provided, having an epitaxial or ion implanted layer thereon (e.g. approximate 0.25 microns thick). Recesses are etched in the active layer where MESFET gates are to be deposited, to lower leakage currents induced by surface states in gallium arsenide and to lower the pinch-off voltage of the MESFETs. In the presently preferred embodiment, the thickness of the active layer in the gate recesses is approximately 0.15 microns, and these active layers are doped to approximately $1.7 \times 10^{17}$ per cm$^3$, which produces a pinch-off voltage of approximately $-1.7$ V. Ohmic contact metallization is produced by a metal such as AuGe/Ni, and Schottky-barrier contact (for MESFET gates and for diodes) is produced by a metal such as Ti/Pt/Au. Forward-biased Schottky diodes are preferably used for voltage level shifting. In addition, a reverse-biased Schottky diode can be used to provide a capacitor. In particular, a reverse-biased Schottky diode is preferably used for the feed-forward capacitor used in the present invention.

Of course, the present invention can be embodied in other III-V compounds than gallium arsenide, and can also be embodied in other gallium arsenide structures. The key teaching of the present invention is that both DC coupling and AC coupling are separately provided between a logic switch node and an output node, and this teaching can be embodied in a very wide variety of device technologies.

Figure 4:
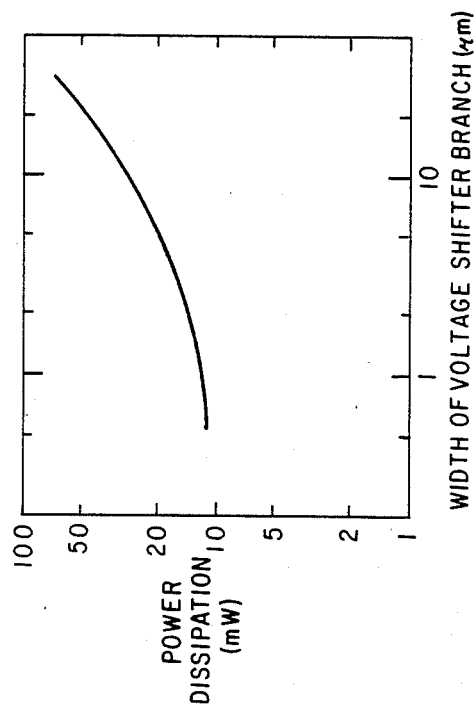
FIG. 4 shows the power dissipation of the cell of FIG. 3 as a function of the width of the voltage shifter/driver branch.
Figure 3:
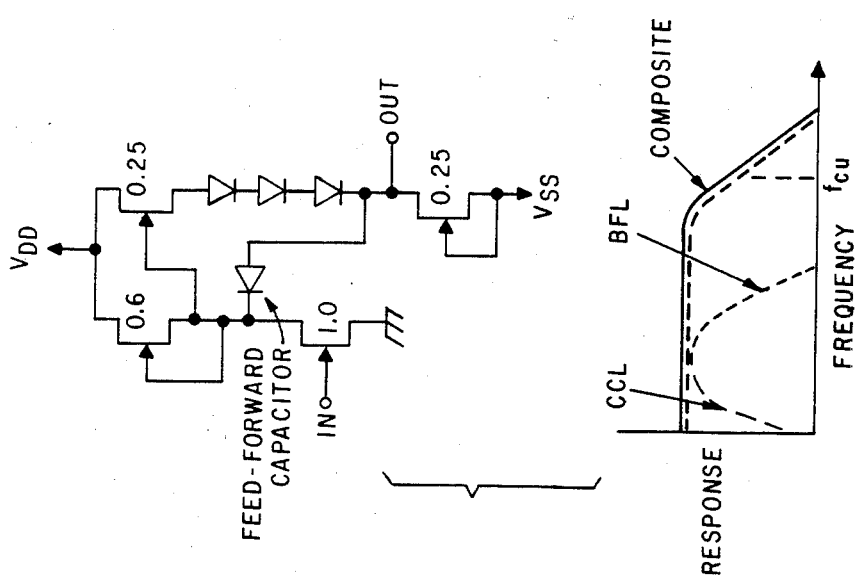
FIG. 3 shows a logic cell according to one embodiment of the present invention, together with its frequency response characteristics.

The present cell combines key features of the BFL and CCL cells (FIG. 3). For convenience, it is called the feed-forward static (FFS) logic gate. In the BFL cell, the width of the voltage-shifting branch, $W_{vs}$, is designed so that its speed capability is approximately equal to that of the logic branch. Accordingly, $W_{vs}$ is usually designed to equal the width of the switch transistor, $W_s$. In the FFS cell, $W_{vs}$ can be greatly reduced (thereby reducing power dissipation) because the high frequency signal is transmitted through the capacitance of the reverse-biased Schottky diode. In principle, $W_{vs}$ can be reduced until the upper cut-off frequency $f_{cu}$ of the VS branch is equal to the lower cut-off frequency $f_{cl}$ of the feed-forward capacitor (FFC) network. Since $f_{cl}$ of the FFC network is in the kHz range while $f_{cu}$ of the VS branch is the GHz range, the $W_{vs}$ of the FFS cell could be more than three orders of magnitude smaller than that of the BFL cell. However, in practice $W_{vs}$ will be limited by processing technology. For good uniformity and reproducibility, $W_{vs}$ is limited to between 2 and 5 micron. FIG. 4 shows the power dissipation of the FFS cell as a function of $W_{vs}$. Note that as $W_{vs}$ approaches 0, all the power dissipation of the cell occurs in the logic branch.

Figure 5:
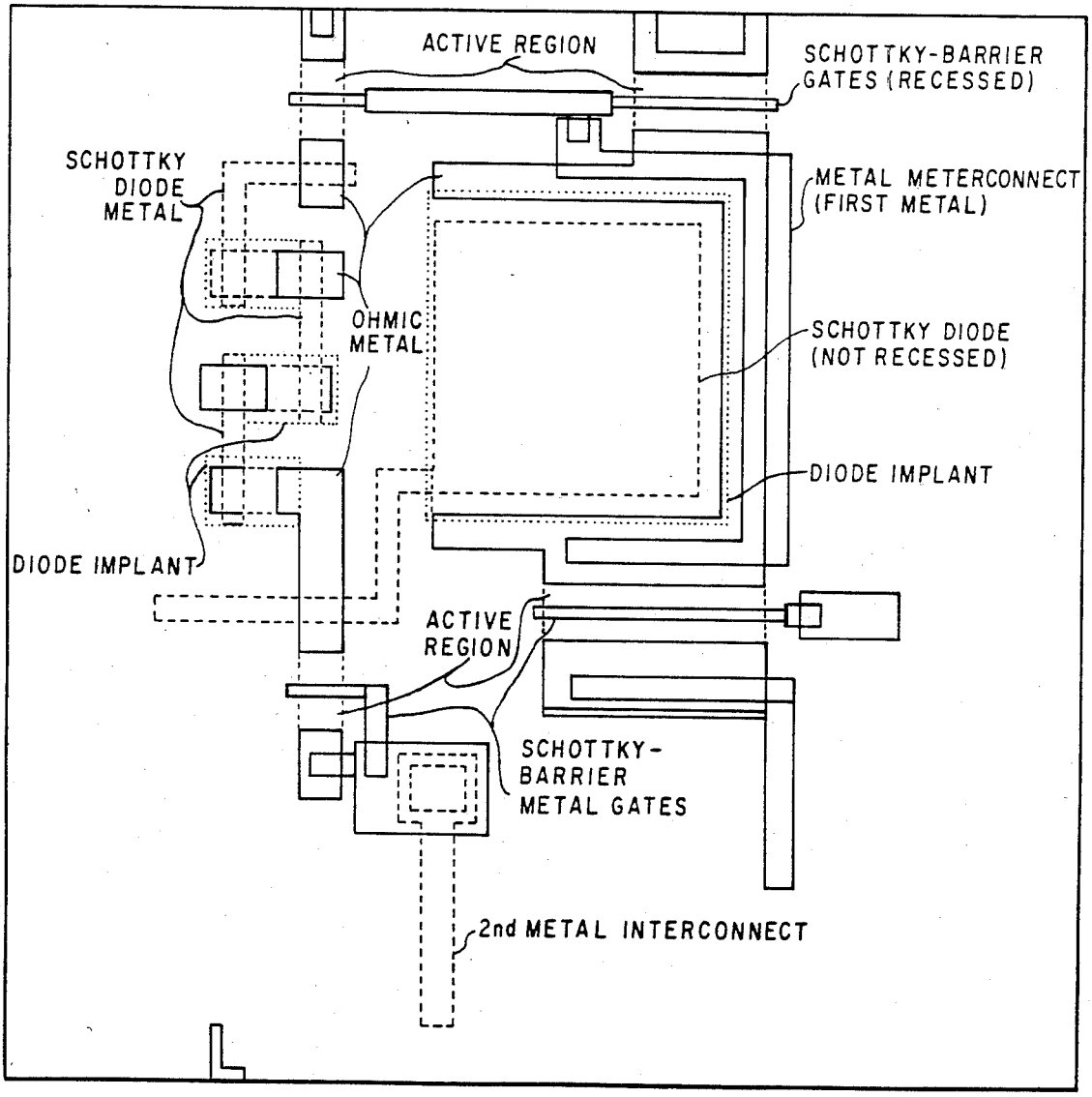
FIG. 5 shows a sample mask layout of the cell of the present invention.

FIG. 5 shows the mask layout of the presently preferred embodiment of the FFS cell (schematically represented by FIG. 3. Here, $W_{vs}$ was chosen to be 5 micron and the feed-forward capacitor was designed to accommodate a fan-out of 3 to 4. The cell area is about 6000 square microns, a factor of about 2 smaller than that of the BFL cell.

The cell was then arranged in 5- and 23-stage ring oscillator circuits both with and without the feed-forward capacitor. These were then fabricated with nominal gatelengths of 0.75 and 1.0 micron and fan-out loading of 1, 2, and 4 (consisting of source-gate capacitances). These circuits, together with the BFL ring oscillator circuits of FIG. 1 previously studied (see Reference 4 cited above) and CCL ring oscillator circuits, were incorporated into a 6 mm×6 mm master field to permit a direct comparison of the various circuit types. Slice size, fabrication process, and evaluation procedures were nearly identical to those previously reported in Reference 4.

Table I shows a summary of the results obtained at standard bias supply voltages; $V_{DD}=6$ V, $V_{SS}=-4$ V. This slice had an active layer doping of about $1.7\times10^{17}$ cm$^{-3}$ and optionally defined gates. Mean values of FET device characteristics at 300 K were: $I_{DSmax}=319$ mA/mm, $I_{DSS}=214$ mA/mm, $V_p=-1.74$ V, $g_m=150$ mS/mm and $R_{on}=3.3$ ohm-mm. The propagation delay, tpd, associated with each ring oscillator type in Table I is on average the mean value of results obtained from about ten functional circuits. The variance to mean $t_{pd}$ ratio is typically about 7%. The results for the BFL cell are about 25% better than those reported earlier (Reference 4) because of the higher active layer doping. This improvement is offset by the increased power dissipation. For the FFS cell, the results show a speed advantage over the BFL cell when FO is equal to or less than 2, and about equal propagation delays for FO=4. However, this is achieved with a power dissipation of only 30% that of the BFL cell. The propagation delays obtained from the 23-stage ring oscillators confirm those obtained from the 5-stage ring oscillators. Note that for the gatelengths used, the fan-out sensitivity of the FFS cell is greater than that of the BFL cell both in absolute and relative terms. By trading-off cell area, the fan-out sensitivity of the FFS cell may be improved by increasing the size of the feed-forward capacitor. It should be noted that, as intended, the FFS cell is a static one. This was experimentally verified by operating inverter chains at 1 Hz and by the fact that the ring oscillators operated at their natural frequency upon application of bias; that is, no cell initialization was required.

TABLE I
SUMMARY OF RESULTS FOR SLICE D2-3, T = 300K

| Cell Type | RO Length (Stages) | Measured L (Micron) | Mean $t_{pd}$(ps) FO = 2 | FO = 4 | Mean $P_d$ (mW) |
|---|---|---|---|---|---|
| BFL | 5 | 1.04 | — | — | |
|  | 5 | 1.37 | 104 | 132 | 56.4 |
|  | 5 | 1.64 | 117 | 154 | |
| FFS | 5 | 1.04 | 80.4 | 127 | |
|  | 23 | 1.04 | 76.7 | | 18.8 |
|  | 5 | 1.37 | 97.2 | 144 | |
|  | 23 | 1.37 | 102.5 | | |
| FFS w/o Capacitor | 5 | 1.04 | 256 | 443 | 18.8 |
|  | 5 | 1.37 | 303 | 461 | |

At the bottom of Table I, the results for the cell without the feed-forward capacitor are shown. This cell was expected to be about 2.8 times slower than the BFL cell. This is confirmed by the data. This data verifies that the high frequency performance of the FFS cell is due to the feed-forward capacitor.

Two factors must be considered in the design of customized embodiments of the FFS cell. First, the reverse-bias Schottky diode which provides the feed-forward capacitor must not be punched through under operating conditions. That is, charge flow to the depletion edge of the capacitor must not be excessively hindered. The feed-forward capacitor, in the presently preferred embodiment (using supply voltages of +6 and −4 V and logic levels of +0.8 V and −2.8 V) will typically see a peak voltage of around 4 V. This means that the doping under the Schottky-barrier metal contact shoud be increased so that punch through does not occur at this voltage. Punch through is undesirable because, at punch through, the area of the boundary of the depleted volume of a semiconductor decreases drastically. This decrease means that the capacitance of a device decreases at the punch through voltage (i.e., further reverse-bias voltage increases will extend the depletion boundary along a much smaller area than before, and therefore fewer carriers will be transported by this voltage shift). That is, any logic signal which imposed a swing on the feed-forward capacitor of greater than its punch through voltage would be poorly coupled through. Therefore, although it is not strictly necessary, it is highly desirable that the doping and thickness be increased to increase the punch through voltage of the feed-forward capacitor above that required by the maximum signals seen on that capacitor. Of course, the capacitor is normally connected so that it remains in reverse bias at all signal levels seen. In the presently preferred embodiment, punch through is avoided by not recessing the Schottky-barrier metallization which defines the feed-forward capacitor. (This metallization is normally deposited in recesses to form MESFET gates.) In an alternative embodiment, an additional mask layer is used during fabrication to pattern a deep ion implant under the feed-forward capacitor, to assure that punch through does not occur during operation, i.e., that the punch through voltage beneath the feed-forward capacitor is greater than 4 V. This is performed as a patterned implant, since excessive pinch-off voltages and leakage currents might occur if the device active regions were exposed to this implant.

It is also desirable that the leakage current of the feed-forward capacitor not exceed a few percent of the current capability of the active load. However, this is not a problem in normal gallium arsenide technology. If leakage were a problem, it could be reduced by adding a very thin insulator (e.g. $Si_3N_4$) layer to (in effect) raise the apparent barrier height of the Schottky diode or by use of a conventional metal-insulator-metal (MIM) capacitor rather thana depletion capacitor.

Second, the capacitance of the FFC should be at least 4 to 5 times greater than the maximum capacitance loading that the gate will encounter. Because these two capacitors act as a divider network, this consideration ensures that the high frequency signal is not excessively attenuated.

That is, in the presently preferred embodiment the capacitance of one MESFET gate, with the associated stray capacitance due to wiring will be on the order of 30 fF. With a fan-out of four, this means that the capacitative loading on the output node can be as much as 120 fF, and therefore the feed-forward capacitor should preferably have a capacitance of at least a half a picofarad. In the presently preferred embodiment, the feed-forward capacitor has an area of 576 square microns, at a capacitance of approximately 0.35 picofarads. This is adequate for fan-out of 3 but should be increased for optimal AC coupling for fan-out of 4 loading.

Figure 8:
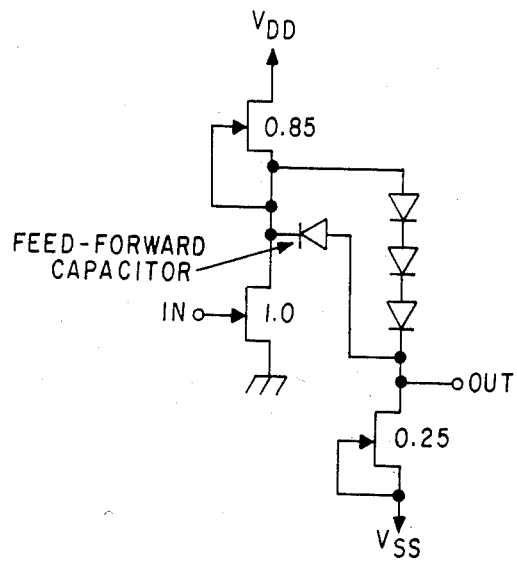
FIG. 8 shows a further embodiment of the present invention, wherein a feed-forward capacitor is used in combination with a level-shifter branch which does not contain a separate pull-up transistor.

Our initial approach to the FFS concept has been to isolate the FFC network from the other circuit nodes as much as possible. Accordingly, the concept has been applied to the BFL cell rather than the SDFL cell. It is also applicable to the SDFL cell, but this approach is not considered as fruitful as other alternatives mentioned below. This embodiment is shown in FIG. 8.

Figure 6:
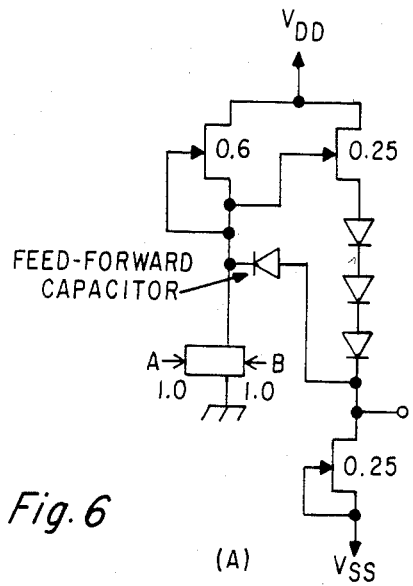
FIGS. 6 and 7 show other logic gates according to the present invention, namely a NAND gate and a NOR gate.
Figure 7:
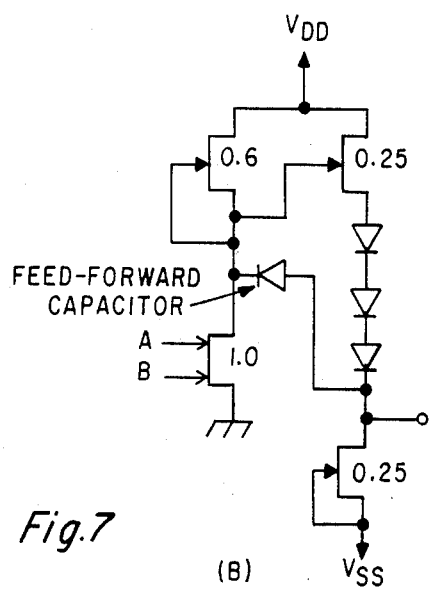

That is, the present invention teaches that the output node of the gate could be both capacitatively coupled and DC coupled to a logic switch node, by separate circuit paths. This teaching can be embodied in a variety of different gallium arsenide MESFET circuit technologies, although FIGS. 3, 6, and 7 show the preferred technology.

A further modification of the FFS cell removes the constraint of processing technology. Here, the current in the DC coupling branch is reduced by increasing the gate to source distance of both the current source and the source follower. Because of the self biasing effect of the source resistance, the current in the VS branch is further reduced. (It is noted that the alternative approach of increasing the gatelengths of these FET's is less attractive because it results in a larger source follower gate stripe capacitance.) A further optional alternative possibility for increasing self bias is through the use of one or two Schottky diodes in the source-gate region of these FET's.

Figure 9:
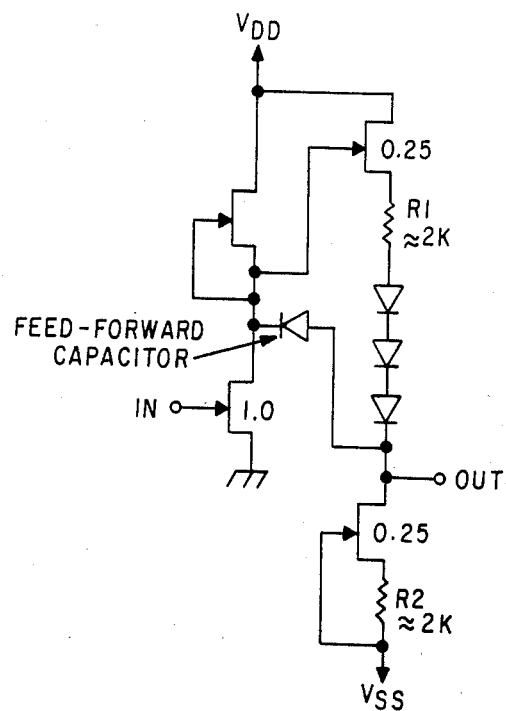
FIG. 9 shows a further embodiment of the invention, wherein an inverter is configured with low-current devices (having increased gate-source spacing) in the voltage shifter/driver branch.

That is, since the DC coupling branch does not have large current demands (i.e., must pass only the frequency component of logic signals from the kilohertz range on down) the devices can be made quite narrow. Thus, in the embodiments of FIGS. 3, 6, and 7, the device widths in the DC branch are shown as minimum widths. (As is conventional, the device widths are shown in these figures as multiples of 20 microns. Thus, the actual minimum device width shown in FIG. 3 is 5 microns. In this technology, a 1 micron gate length and 3 micron gate-to-source and gate-to-drain spacings are also commonly used.) However, even these minimum-width transistors still provide substantially more current than is required. This means that the power dissipation of the cell is also more than is required. To further reduce power dissipation, the widths of these devices could be reduced below 5 microns. However, yield is reduced if the device width is reduced too far. Thus, to reduce the current in the DC branch of the device, it is preferable to modify these devices to further reduce their current. Preferably this is done by increasing the gate source spacing. That is, in the embodiment of FIG. 9, the pull-up and pull-down devices in the DC branch of the cell still have gate widths of 5 microns, gate lengths of 1 micron, and gate-to-drain spacings of 3 microns, but their gate-to-source spacings are increased to 20 microns and power is reduced by about 4 m². This economizes on power, which is one of the chief objectives and chief advantages of the present invention.

A novel GaAs MESFET logic gate has been described. The first embodiment of the gate has been shown to consume about 30% of the power and to be about 30% faster than the more conventional BFL gate. Based on published results, the inventive gate consumes 55% of the power and is about 55% faster than the SDFL gate. If we assumed that a gate's figure of merit is inversely proportional to its delay-power product, then it has been demonstrated that the figure of merit for the FFS cell of the present invention is 4.3 and 2.8 times greater than those of the BFL and SDFL cells respectively. As previously discussed, further reduction in power dissipation can be anticipated, in which case the figure of merit of the FFS cell is expected to approach 6.5 and 4.3 times that of the BFL and SDFL cells respectively.

The present invention is not only applicable to III-V MESFETs, but is also applicable to silicon MESFET logic. In this case, the fabrication techniques are different, and the threshold voltages and signal levels are accordingly different, but the invention still teaches that a logic switch node is coupled to an output node both through an AC path (preferably a depletion capacitor) and also through a separate DC path (preferably a voltage level shifter circuit).

As will be apparent to those skilled in the art, the present invention provides a fundamental new logic gate, which can be embodied in a tremendous variety of integrated circuits. The device and processing parameters set forth above can be widely varied, and are not by any means limiting. Thus, the scope of the present invention is expressly not limited except as stated in the accompanying claims, which are to be construed broadly.

What is claimed is:

1. A logic gate comprising:
   (a) a logic circuit, comprising at least one input MESFET transistor having a gate electrode connected to receive at least one input signal, a drain connected to control a logic switch node in correspondence to said input signals and a source connected to a source of reference potential;
   (b) an output node;
   (c) a voltage level shifter circuit connected between said output node and said logic switch node to provide DC coupling and level shift from said logic switch node to said output node;
   (d) a feed-forward capacitor, said feed-forward capacitor being connected to a-c couple said output node to said logic switch node;
   (e) a load device connected between a positive bias potential and said logic switch node; and
   (f) a pull-down device connected between said output node and a negative bias potential.

2. The logic gate of claim 1, wherein said feed-forward capacitor comprises a capacitance of at least one-half picofarad.

3. The logic gate of claim 1, wherein said voltage level shifter circuit comprises a source-follower transistor with a gate electrode connected to said logic switch node, a drain connected to said positive bias potential, and a source connected to said output node.

4. The logic gate of claim 1, wherein said input transistor comprise a MESFET transistor having a gallium arsenide channel region.

5. The logic gate of claim 1, wherein said feed-forward capacitor comprises a reverse biased Schottky-barrier diode.

6. The logic gate of claim 1, wherein said voltage level shifter circuit comprises:
   a source-follower transistor comprising a gate connected to said logic switch node, and
   a plurality of level-shifting diodes connected between said source-follower transistor and said output node.

7. The logic gate of claim 1, wherein said logic circuit comprises only one of said input transistors, configured as an inverter.

8. The logic gate of claim 1, wherein said logic circuit comprises a plurality of said input transistors in parallel, configured as a NOR gate.

9. The logic gate of claim 1, wherein said logic circuit comprises a plurality of said input transistors in series, configured as a NAND gate.

10. The logic gate of claim 1, wherein said load device comprises a MESFET transistor having the source and gate electrode both connected to said logic switch node, and the drain connected to said positive bias potential.

11. The logic gate of claim 1, wherein said load device comprises a resistor having one terminal connected to said logic switch node and the other terminal connected to said positive bias potential.

12. The logic gate of claim 1, wherein said pull-down device comprises a MESFET transistor having the source and gate electrode both connected to said negative bias potential, and the drain connected to said output node.

13. The logic gate of claim 1, wherein said pull-down device comprises a resistor having one terminal connected to said negative bias potential, and the other terminal connected to said output node.

14. The logic gate of claim 1, wherein said voltage level shifter comprises one or more forward bias Schottky-barrier diodes connected in series.

15. An integrated circuit comprising:
(a) a substrate comprising a Group III-V semiconductor material;
(b) a plurality of logic gates, each said logic gate comprising an output node and at least one input node, each said logic gate comprising:
(c) a logic circuit, comprising at least one input transistor having a gate electrode connected to said input node, a drain controlling a logic switch node in correspondence to signals received at said input nodes and a source connected to a source of reference potential;
(d) a DC coupling circuit, connected between said logic switch node and said output node to DC couple said logic switch node to said output node; and
(e) an AC coupling circuit, said AC coupling circuit being connected between said logic switch node and said output node to a-c couple said output node to said logic switch node;
(f) wherein said AC coupling circuit comprises circuit elements which are not included in said DC coupling circuit;
(g) said logic gates being interconnected to implement a predetermined circuit function;
(h) a load device connected between a positive bias potential and said logic switch node; and
(i) a pull-down device connected between said output node and a negative bias potential.

16. The integrated circuit of claim 15, wherein said input transistors are MESFET transistors.

17. The integrated circuit of claim 15, wherein said DC coupling circuit comprises a plurality of level-shifting diodes.

18. The integrated circuit of claim 17, wherein said DC coupling branch comprises a source follower transistor in series with said level-shifting diodes, said source follower transistor having a gate electrode coupled to said logic switch node.

19. The integrated circuit of claim 17, wherein said DC coupling circuit further comprises a pull-down transistor connected between said output node and a source of negative potential.

20. The integrated circuit of claim 19, wherein said pull-down transistor comprises a gate electrode to source spacing which is greater than the gate electrode width of said pull-down transistor.

21. The integrated circuit of claim 18, wherein said source follower transistor comprises a gate to source spacing which is greater than the gate width of said source follower transistor.

* * * * *